United States Patent [19]

Palumbo

[11] Patent Number: 4,794,437
[45] Date of Patent: Dec. 27, 1988

[54] ARC GAP FOR INTEGRATED CIRCUITS

[75] Inventor: William J. Palumbo, Union Township, Hunterdon County, N.J.

[73] Assignee: General Electric Company, Fairfield, Conn.

[21] Appl. No.: 895,365

[22] Filed: Aug. 11, 1986

[51] Int. Cl.$^4$ .............. H01L 29/78; H01L 27/02; H01L 29/34; H01L 29/06
[52] U.S. Cl. ................... 357/23.13; 357/51; 357/54; 357/55; 357/68; 357/85
[58] Field of Search ............. 357/23.13, 40, 55, 85, 357/68, 71, 54, 51, 53

[56] References Cited

U.S. PATENT DOCUMENTS

| 4,252,840 | 2/1981 | Minami | 357/54 |
| 4,364,078 | 12/1982 | Smith et al. | 357/54 |

FOREIGN PATENT DOCUMENTS

| 3435306 | 4/1986 | Fed. Rep. of Germany | 357/55 |
| 56-138938 | 10/1981 | Japan | 357/55 |
| 58-169952 | 10/1983 | Japan | 357/23.13 |
| 59-2357 | 1/1984 | Japan | 357/23.13 |

OTHER PUBLICATIONS

S. H. Cohen et al., "An Improved Input Protection Circuit for C-MOS/SOS Arrays", *IEEE Transactions on Electron Devices*, vol. ED-25 (Aug. 1978) pp. 926-932.

R. E. Thun, "Deposited, Noise-Reducing Ground Plane", *IBM Technical Disclosure Bulletin*, vol. 10 (Jun. 1967) p. 87.

*Primary Examiner*—J. Carroll
*Attorney, Agent, or Firm*—Stanley C. Corwin; Birgit E. Morris; Kenneth R. Glick

[57] ABSTRACT

An arc gap for an integrated circuit on a surface of a substrate of semiconductor material includes a first conductive strip over and insulated from the substrate surface. A layer of an insulating material is over the first conductive strip and a second conductive strip is on the insulating layer. The insulating layer has an opening therethrough which exposes at least a portion of the first conductive strip. The second conductive strip extends to substantially the edge of the opening in the insulating layer so that the two conductive strips are exposed to each other through the opening. The two conductive strips may be portions of a metallization pattern for the integrated circuit.

7 Claims, 1 Drawing Sheet

ARC GAP FOR INTEGRATED CIRCUITS

The present invention relates to arc gaps for integrated circuits, and more particularly, to arc gaps for integrated circuits which have multi-level metallization.

BACKGRUND OF THE INVENTION

In integrated circuits it is often desirable to provide means for protecting the circuit from unexpected charges which could short out, open or otherwise damage the circuit. Various techniques have been used including forming arc gaps in the circuit. Such arc gaps have taken the form of two metal areas having slightly spaced apart edges. The metal areas are generally planar, i.e. are in the same plane, and are generally formed of the same metal used for the metallization connecting the various components of the integrated circuit. Also, the opposed edges of the metal areas are often sawtoothed with the teeth being interdigitated. One problem with this type of arc gap is that it is relatively large and therefore takes up excess room, particularly for high density integrated circuits. Also, because of its size, its position on the integrated circuit is restricted to areas where it does not interfere with other components of the integrated circuit. In addition, the spacing between the metal areas, which controls the arcing voltage, is formed by the photolithographic etching technique used to form the metallization and spacing between the lines of the metallization. Thus, the minimum spacing between the metal areas is dependent on other features of the integrated circuit which may not be the optimum for the desired operation of the arc gap.

SUMMARY OF THE INVENTION

An integrated circuit having incorporated therein an arc gap includes a body of semiconductor material and a pair of strips of conductor material extending over the body and spaced from each other by a layer of insulating material. The arc gap is formed by an opening through the insulating layer exposing at least a portion of one of the strips at the bottom of the opening. The other strip extends at least to approximately the edge of the opening so that the two strips are exposed to each other through the opening.

DETAILED DESCRIPTION OF PREFERRED EMBODIMENTS

Figure 1:
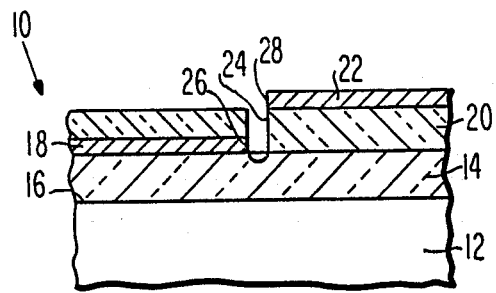
FIG. 1 is a sectional view of a portion of an integrated circuit showing one form of an arc gap of the present invention.

Referring initially to FIG. 1, an integrated circuit having a basic form of the arc gap of the present invention is generally designated as 10. The integrated circuit 10 includes a body 12 of a semiconductor material, such as single crystalline silicon, having a layer 14 of an insulating material, such as silicon oxide, on the surface 16 thereof. The body 12 may be a substrate of the semiconductor material or may be an epitaxial layer of the semiconductor material on an insulating substrate, such as sapphire or silicon oxide. The insulating layer 14 may be formed by thermally oxidizing the surface 16 of the substrate 12 or by chemical vapor deposition from a gas containing silicon, such as silane, and oxygen. On the insulating layer 14 is a first layer 18 of a conductive material, such as a metal or doped polycrystalline silicon. Covering the first conductive layer 18 and any exposed area of the first insulating layer 14 is a second insulating layer 20. The second insulating layer 20 may be deposited silicon oxide or a glass, such as a phosphorus silicate glass or a boron phosphorus silicate glass. On the second insulating layer 20 is a second strip 22 of a conductive material. Thus, the first and second conductive strips 18 and 22 are spaced apart and insulated from each other by the second insulating layer 20. The second insulating layer 20 has an opening 24 therethrough at least to the first insulating layer 14 which exposes at least a portion of the first conductive strip 18 at the bottom of the opening 24. As shown in FIG. 1, the opening 24 exposes an edge 26 of the first conductive strip 18. The second conductive strip 22 extends to the opening 24 so that an edge 28 of the sccond conductive strip 22 is exposed to the edge 26 of the first conductive strip 18 through the opening 24. Thus, there is provided an arc gap between the edges 26 and 28 of the conductive strips 18 and 22.

The conductive strips 18 and 22 may be portions of the metallization of an integrate circuit having multi-level metallization. The arc gap can be formed anywhere in the metallization pattern where the two levels overlap by forming the opening 24 in the second insulating layer 20 which is between the two levels so as to expose surfaces of the too conductive strips to each other. Since the arc gap is formed directly from the metallization pattern and requires only the addition of a relatively small opening, the arc gap does not add any appreciable size to the overall integrated circuit. Also, the spacing between the two conductive strips 18 and 22 can be controlled relatively accurately by controlling the thickness of the second insulating layer 20 which can be made relatively thin to provide for low operating voltages of the arc gap.

Figure 2:
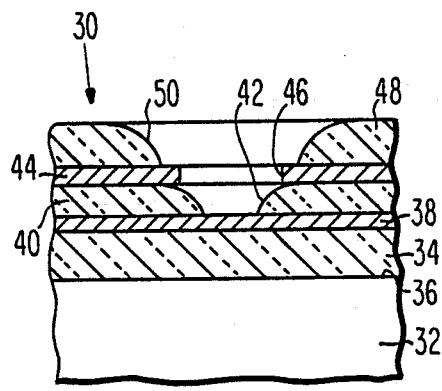
FIG. 2 is a sectional view of a portion of an integrated circuit showing another form of the arc gap of the present invention.
Figure 3:
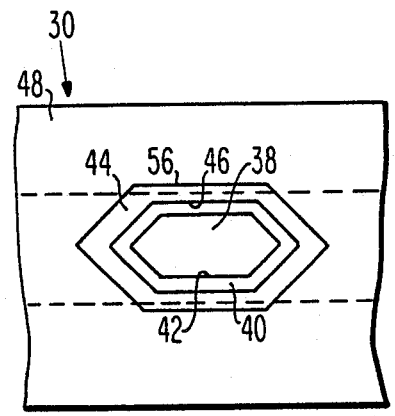
FIG. 3 is a top view of the portion of the integrated circuit shown in FIG. 2.

Referring to FIGS. 2 and 3, an integrated circuit having another form of the arc gap of the present invention is generally designated as 30. The integrated circuit 30 includes a body 32 of semiconductor material having a first layer 34 of insulating material on a surface 36 thereof. A first conductive strip 38, which can be a part of the first level metallization, is on the first insulating layer 34. A second layer 40 of insulating material is over the first conductive strip 38 and any exposed area of the first insulating layer 34. The second insulating layer 40 has an opening 42 therethrough which exposes a portion of the first conductive strip 38. A second conductive strip 44 is on the second insulating layer 42 and has an opening 46 therethrough which is in alignment with the opening 42 in the second insulating layer 40. The edge of the opening 46 in the second conductive strip 44 is adjacent the edge of the opening 42 in the second insulating layer 40 so that the edge 46 is exposed to the first conductive strip 38 through the opening 42. A protective layer 48 of an insulating material, such as silicon oxide, boron phosphorus silicate glass, or phosphorus silicate glass, is over the second conductive strip 44 and any exposed area of the second insulating layer 40. The protective layer 48 has an opening 50 therethrough in alignment with but slightly larger than the opening 46 in the second conductive strip 44. The second conductive strip 44 may be a portion of the second level metallization of the integrated circuit.

Thus, there is provided an arc gap between the edge surface of the opening 46 in the second conductive strip 44 and the area of the first conductive strip 38 exposed at the bottom of the opening 42 in the second insulating layer 40. Although the openings 42, 46 and 50 are shown to be hexagonal, they can be of any desired shape. Also, the conductive strips 38 and 44 may be parallel to each other or may cross each other.

Figure 4:
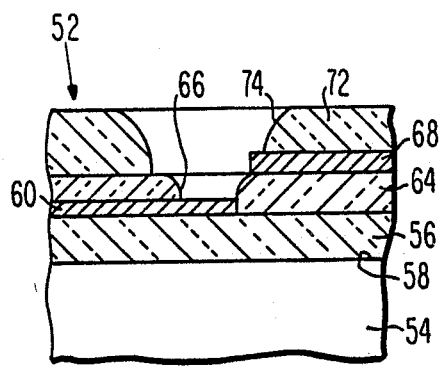
FIG. 4 is a sectional view of a portion of an integrated circuit showing still another form of the arc gap of the present invention.
Figure 5:
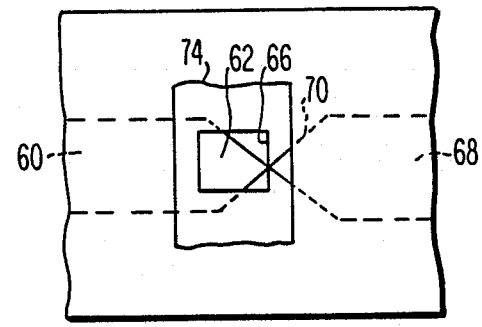
FIG. 5 is a top view of the portion of the integrated circuit shown in FIG. 4.

Referring to FIGS. 4 and 5, an integrated circuit having still another form of the arc gap of the present invention is generally designated as 52. The integrated circuit 52 includes a body 54 of semiconductor material having a first layer 56 of insulating material on a surface 58 thereof. A first conductive strip 60 is on the first insulating layer 56 and, as shown in FIG. 5, has a pointed end portion 62. A second layer 64 of insulating material is over the first conducting strip 60 and the exposed areas of the first insulating layer 56. The second insulating layer 64 has an opening 66 therethrough and is positioned so that the pointed end 62 of the first conductive strip 60 extends across the opening 66 with the tip of the pointed end 62 being at a side of the opening 66. A second conductive strip 68 is on the second insulating layer 64 and, as shown in FIG. 5, has a pointed end portion 70. The pointed end 70 of the second conductive strip 68 extends to the side of the opening 66 to which the pointed end 62 of the first conductive strip extends so that the points of the two pointed ends 62 and 70 are adjacent each other. Thus, the pointed tips of the two conductive strips 68 and 60 are exposed to each other through the opening 66. A protective layer 72 of an insulating material extends over the second conductive strip 68 and any exposed area of the second insulating layer 64. The protective layer 72 has an opening 74 therethrough which is larger and over the opening 66 in the second insulating layer 64.

Thus, there is provided an arc gap for an integrated circuit which has multi-level metallization wherein conductive strips of two adjacent levels extend to an opening through the insulating material between the conductive strips so that the conductive strips are exposed to each other through the opening. Such arc gaps can be made small in size so that they do not take up appreciable space in the integrated circuit and can be located wherever the conductive strips of the two levels cross or are otherwise opposed to each other. Also, the operating voltage of the arc gap can be controlled by the thickness of the layer of insulating material between the two levels which can be made relatively thin.

I claim:

1. In an integrated circuit which includes a body of semiconductor material having a first layer of insulating material thereon, and a first conductive strip over at least a portion of said insulating layer, a second insulating layer over said first conductive strip and a second conductive strip over at least a portion of said second insulating layer, an arc gap comprising an opening through said second insulating layer exposing at least a portion of said first strip at the bottom of the opening and the second strip extending to substantially the edge of the opening so that the two strips are exposed to each other through said opening.

2. An integrated circuit in accordance with claim 1 wherein said first conductive strip extends across said opening in the second insulating layer.

3. An integrated circuit in accordance with claim 2 wherein the second conductive strip extends across the opening in the second insulating layer and has an opening therethrough which is aligned with the opening in the second insulating layer, and the edges of the opening in the second conductive strip are adjacent the edge of the opening in the second insulating layer.

4. An integrated circuit in accordance with claim 3 wherein the openings in the second insulating layer and the second conductive strip are polygonal.

5. An integrated circuit in accordance with claim 1 including a protective layer over the second conductive strip and the second insulating layer, said protective layer having an opening therethrough aligned with and larger than the openings in the second insulating layer and the second conductive strip.

6. An integrated circuit in accordance with claim 2 wherein the first conductive strip has a pointed end portion which extends across the opening in the first insulating layer with the piint being adjacent the side of the opening and the second conductive strip has a pointed end portion which extends to the side of the opening so that the points of the conductive strips are adjacent each other.

7. An integrated circuit in accordance with claim 6 including a protective layer over the second conductive strip and the second insulating layer, said protective layer having an opening therethrough which is aligned with and larger than the opening in the second insulating layer.

* * * * *